(12) United States Patent
Courcier et al.

(10) Patent No.: US 10,281,100 B2
(45) Date of Patent: May 7, 2019

(54) DEVICE COMPRISING AT LEAST ONE WAVELENGTH CONVERTER, LIGHT MODULE AND LIGHTING DEVICE FOR AN AUTOMOTIVE VEHICLE COMPRISING SUCH A DEVICE

(71) Applicant: Valeo Vision, Bobigny (FR)

(72) Inventors: Marine Courcier, Paris (FR); Pierre Albou, Paris (FR)

(73) Assignee: VALEO VISION, Bobigny (FR)

(*) Notice: Subject to any disclaimer, the term of this patent is extended or adjusted under 35 U.S.C. 154(b) by 219 days.

(21) Appl. No.: 15/201,709

(22) Filed: Jul. 5, 2016

(65) Prior Publication Data

US 2017/0045191 A1 Feb. 16, 2017

(30) Foreign Application Priority Data

Jul. 8, 2015 (FR) ...................... 15 56475

(51) Int. Cl.
*F21S 41/14* (2018.01)
*F21S 43/20* (2018.01)
(Continued)

(52) U.S. Cl.
CPC ............... *F21S 41/14* (2018.01); *F21S 41/16* (2018.01); *F21S 41/20* (2018.01); *F21S 41/285* (2018.01);
(Continued)

(58) Field of Classification Search
CPC .. F21S 41/16; F21S 41/12; F21S 41/20; F21S 41/14; F21S 41/30; F21S 41/675
(Continued)

(56) References Cited

U.S. PATENT DOCUMENTS 6,352,359 B1 * 3/2002 Shie .................. F21V 5/002
362/522
7,530,710 B2 5/2009 Berben et al.
(Continued)

FOREIGN PATENT DOCUMENTS

DE 102010028949 11/2011
DE 102010028949 A1 11/2011
(Continued)

*Primary Examiner* — Anh T Mai
*Assistant Examiner* — Matthew J. Peerce
(74) *Attorney, Agent, or Firm* — Oblon, McClelland, Maier & Neustadt, L.L.P.

(57) ABSTRACT

An optical device comprising: an optical element for converting wavelength formed from a first optical medium having a first refractive index. The converter element receives an incident light beam at a first face and converts it into a converted light beam. The reflective optical element, positioned on a second face of the converter is configured to reflect the converted light beam. The optical device comprises a primary optical element formed from a second optical medium having a second refractive index substantially identical to the first refractive index. A first face of the primary optical element being positioned in proximity to the first face of the converter element, the primary optical element receives the incident light beam and transmits it to the converter. A second face of the primary optical element forms an output face for outputting the converted light beam to minimize parasitic reflections of the converted light beam off itself.

16 Claims, 1 Drawing Sheet

(51) Int. Cl.
*F21S 41/30* (2018.01)
*F21S 43/30* (2018.01)
*F21S 41/20* (2018.01)
*G02B 5/09* (2006.01)
*H01S 5/00* (2006.01)
*F21S 41/32* (2018.01)
*F21S 41/675* (2018.01)
*F21S 43/13* (2018.01)
*F21S 43/31* (2018.01)
*F21S 43/40* (2018.01)
*F21S 41/16* (2018.01)
*H01S 5/323* (2006.01)

(52) U.S. Cl.
CPC .......... *F21S 41/30* (2018.01); *F21S 41/321* (2018.01); *F21S 41/675* (2018.01); *F21S 43/13* (2018.01); *F21S 43/20* (2018.01); *F21S 43/26* (2018.01); *F21S 43/30* (2018.01); *F21S 43/31* (2018.01); *F21S 43/40* (2018.01); *G02B 5/09* (2013.01); *H01S 5/005* (2013.01); *H01S 5/32341* (2013.01)

(58) Field of Classification Search
USPC ........................................................ 362/510
See application file for complete search history.

(56) References Cited

U.S. PATENT DOCUMENTS

| | | | |
|---|---|---|---|
| 9,383,070 B2 | 7/2016 | Khrushchev | |
| 2007/0297171 A1 | 12/2007 | Berben et al. | |
| 2013/0058114 A1* | 3/2013 | Reiners | F21S 48/1225 362/510 |
| 2015/0043233 A1* | 2/2015 | Bauer | B60Q 11/00 362/510 |
| 2015/0078022 A1 | 3/2015 | Bauer | |
| 2015/0124468 A1 | 5/2015 | Reiners | |
| 2015/0167905 A1 | 6/2015 | Khrushchev | |

FOREIGN PATENT DOCUMENTS

| | | |
|---|---|---|
| DE | 102013223131 | 5/2015 |
| DE | 102013223131 A1 | 5/2015 |
| JP | 2015041475 | 3/2015 |
| JP | 2015041475 A | 3/2015 |
| WO | 2013134803 A1 | 9/2013 |
| WO | WO 2013134803 | 9/2013 |
| WO | 2013182450 A1 | 12/2013 |
| WO | WO 2013182450 | 12/2013 |

* cited by examiner

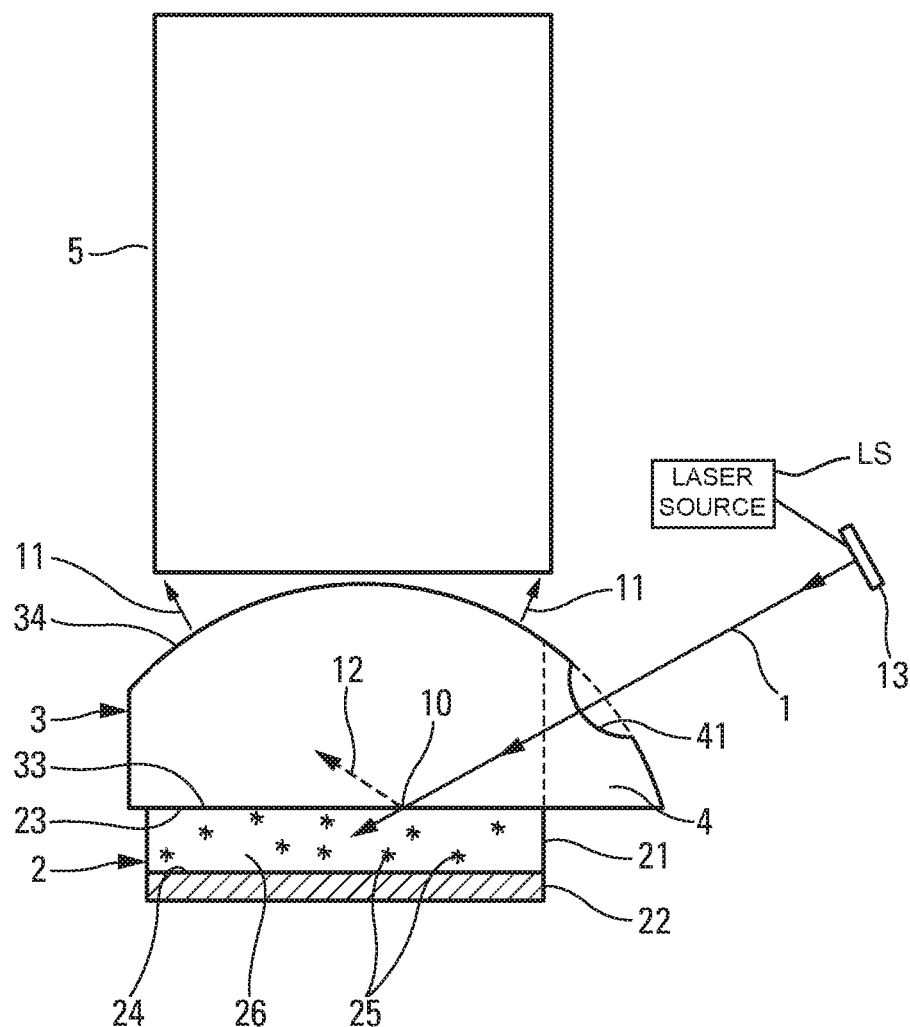

DEVICE COMPRISING AT LEAST ONE WAVELENGTH CONVERTER, LIGHT MODULE AND LIGHTING DEVICE FOR AN AUTOMOTIVE VEHICLE COMPRISING SUCH A DEVICE

CROSS-REFERENCE TO RELATED APPLICATIONS

This application claims priority to the French application 1556475 filed Jul. 8, 2015, which applications are incorporated herein by reference and made a part hereof.

BACKGROUND OF THE INVENTION

1. Field of the Invention

The invention relates to an optical device comprising at least one wavelength converter, as well as a light module incorporating such a device and a lighting device such as a headlamp or a signaling lamp for an automotive vehicle comprising such a module.

2. Description of the Related Art

In the field of automotive lighting, it is known practice, when using laser diodes as a light source, to use an optical element for converting wavelength, also called a phosphor, in order to obtain white light from the monochromatic, often blue, light provided by the laser source.

The laser beam, after potential optical treatments such as scanning and/or diffusion, therefore illuminates the converter. The light beam arising from the converter is then, in the context of such an application, transmitted to an optical projection system with the aim of forming an illuminating beam projected onto the road.

For luminous efficiency and heat reasons in particular, it is often preferable to use a converter functioning by reflection.

Nonetheless, in this case, losses occur, in particular linked to parasitic reflections at the point of incidence of the laser beam on the input surface of the wavelength converter, as well as total internal reflections—that are also parasitic—of the beam inside the material forming the converter, leading to a portion of the beam being absorbed or even being deflected outside the desired angle for output to the optical projection system. These mechanisms are amplified by the fact that the distance between the converter and the projection system must be sufficient to allow the laser beam to hit the converter.

SUMMARY OF THE INVENTION

An aim of the invention is to overcome these drawbacks by allowing light losses to be minimized and the efficiency of the lighting device to be improved, and this at the least cost.

To this end, a subject of the invention is an optical device comprising at least one optical element for converting wavelength, formed from a first optical medium having a first refractive index, the converter element being configured to receive an incident light beam at a first of its faces and to convert the incident light beam into a converted light beam.

The device is remarkable in that it additionally comprises:

a reflective optical element, positioned on a second of the faces of the converter, the second face being opposite the first face, the reflective element being configured to reflect the converted light beam;

an optical element, referred to as the primary optical element, formed from a second optical medium having a second refractive index that is substantially identical to the first refractive index, a first of the faces of the primary element being positioned in proximity to the first face of the converter element, the primary element being configured to receive the incident light beam and to transmit it to the converter, a second of the faces of the primary element forming the face of the primary element for outputting the converted light beam, the second face of the primary element being configured to minimize parasitic reflections of the converted light beam off itself.

Thus, the invention provides the addition of an optical element, referred to as the primary optical element, through which the light beam passes before striking the wavelength converter as well as after its conversion, the primary element having a refractive index that is as close as possible to that of the wavelength-converting material, and having an output face configured to minimize parasitic reflections of the light beam off this face in the outgoing direction and, advantageously, also in the incoming direction. Advantageously, the output face substantially takes the form of a sphere.

The invention therefore allows the performance of the device in which it is integrated to be improved, at a cost limited to that of a single additional optical part.

According to various embodiments of the invention which may be taken together or separately:

the second face of the primary element is convex;

the second face of the primary element substantially takes the form of a spherical cap;

the spherical cap is substantially centered on the first face of the primary element;

the primary element comprises a portion, referred to as the input portion, configured to receive the incident light beam;

the input portion of the primary element is positioned off-center with respect to the optical element for converting wavelength;

the second face of the primary element concavely bulges at the input portion;

the second face of the primary element takes the form of a spherical cap at the input portion;

the first face of the primary element is positioned substantially on the first face of the converter element;

the primary element and the converter element are joined;

the primary element is bonded to the converter element;

the primary element is overmolded onto the converter element;

the primary element is made of one and the same material as the converter element;

the material forming the converter element comprises grains that carry out the wavelength conversion, in particular embedded in a binder;

the incident light beam is monochromatic;

the incident light beam is provided by a laser source;

the second face of the primary element is planar and microstructured so as to minimize total internal reflections off this face.

The invention also relates to a light module comprising an optical device as specified above, and which additionally comprises a light source providing the incident light beam, means for scanning the light beam that are positioned upstream of the primary optical element, and an objective that receives the light beam arising from the second face of the primary element.

Advantageously, the spherical cap forming the second face of the input portion of the primary element is centered on the scanning means.

Advantageously, the scanning means comprise a device with an oscillating mirror, for example of MEMS (microelectromechanical system) type, imparting a one- or two-dimensional scan to the incident beam.

Lastly, the invention relates to a lighting and/or signaling device, in particular for an automotive vehicle, comprising such a module.

These and other objects and advantages of the invention will be apparent from the following description, the accompanying drawings and the appended claims.

BRIEF DESCRIPTION OF THE ACCOMPANYING DRAWINGS

Other features and advantages of the invention will emerge from the following detailed description, given by way of indication and illustrated by the appended drawings, in which:

FIG. 1 is a diagrammatic partial cross-sectional view of one embodiment of a lighting device according to the invention.

DETAILED DESCRIPTION OF THE PREFERRED EMBODIMENTS

FIG. 1 shows an optical converter element 2 for converting wavelength, intended to produce a substantially white-colored light beam from a monochromatic incident light beam 1.

The light beam 1 is, for example, produced by one or more laser sources LS, such as laser diodes for example, and is then typically blue colored.

The light beam 1 may have undergone various optical treatments before its arrival at the converter element 2, such as for example being passed through means that impart a one- or two-dimensional scan thereto and/or diffusion means for enlarging the laser spot.

Of these various conventionally implemented treatments, only a device with an oscillating mirror 13, for example of MEMS (microelectromechanical system) type, imparting a one- or two-dimensional scan to the light beam 1, is illustrated in FIG. 1.

The converter element 2 comprises an optical converter material 21 that carries out the wavelength conversion and a reflective material 22.

The converter material 21 is formed in any known manner, for example from grains 25 that carry out the wavelength conversion, embedded in a binder 26. The grains 25 may be formed from europium garnet and yttrium aluminum garnet (YAG). The binder 26 is, for example, a silicone-based material.

The converter element 2 takes, for example, the general form of a wafer, the laser or light beam 1 being received via a first face 23 of the converter material 21 and the reflective material 22 being positioned on the side of a second face 24 of the converter material 21, opposite the first face 23. The reflective material 22 is advantageously bonded to the second face 24 by any known means; adhesive, overmolding or other. In the case of bonding with adhesive, a transparent adhesive, referred to as an index-matching adhesive, which has a refractive index that is as close as possible to the geometric mean of the indices of the assembled materials, is used. The reflective material 22 is, for example, made of aluminum, this reflective material 22 having good heat dissipation qualities in particular.

According to the invention, an optical element 3, referred to as the primary optical element, whose refractive index is substantially identical, i.e., as near as possible, and advantageously equal to that of the converter element 2, is interposed in the path of the light beam 1. It is, for example, formed from the same material as the binder 26 of the converter material 21. By way of example, the primary optical element 3 may be made of poly(methyl methacrylate) (PMMA), polycarbonate or silicone, or even glass.

This primary optical element 3 is positioned in proximity to the first face 23 of the converter element 2, as close as possible thereto, preferably joined, e.g., bonded by one of its faces 33 to the first face 23 using an optical adhesive with a refractive index that is substantially equal to that of the converter element 2 and primary optical element 3, or overmolded onto the converter element 2, onto the first face 23.

The primary optical element 3 receives the laser or light beam 1 via another of its faces, denoted by 34, that is substantially facing the face 33. The laser or light beam 1 therefore penetrates the primary optical element 3 via the face 34, and passes through the primary optical element 3 to penetrate the converter material 21. Then the laser or light beam 1 is reflected by the reflective material 22 in the direction of the face 34 of the primary optical element 3. Inside the converter material 21, the impacts of the laser or light beam 1 on the grains 25 cause, after absorption by the crystal lattice of the grains 25 and re-emission, a change in the wavelength of the photons forming the incident or light beam 1, this phenomenon being accompanied by a certain amount of diffusion of this beam.

Furthermore, advantageously, grains (not shown) whose function is to diffuse the incident or light beam 1 so as to remove any danger posed by the device are added to the binder 26 of the converter element 2.

The beam exiting the primary optical element 3 is then collected by a beam projection objective 5, for example for illuminating the road in an automotive lighting application.

The two arrows 11 show the limit paths of the laser or light beam 1 arising from the primary optical element 3 so that they can be used by the beam projection objective 5.

According to the invention, the face 34 of the primary optical element 3 is configured to minimize parasitic reflections of the laser or light beam 1 off this face 34.

To this end, it convexly bulges for example, advantageously substantially taking the form of a spherical cap, the sphere then preferably being substantially centered on the interface of the first face 23 and the face 33, in an area 10 where the laser or light beam 1 strikes this surface.

In this way, as the refractive indices of the converter element 2 and the primary optical element 3 are close or, preferably, identical, the total internal reflections of the laser or light beam 1 off the first face 23 are very greatly minimized, thus avoiding light-guiding phenomena in the converter material 21 which could lead to a portion of the light exiting outside the usable area, or even the light being partially absorbed, and therefore to light losses.

Moreover, parasitic reflections of the incident laser or light beam 1 off the face 33 of the primary optical element 3, diagrammatically shown by a dotted arrow 12, are minimized for the same reason, thereby avoiding a portion of the light being lost or being directly transmitted to the objective without passing through the wavelength converter element 2.

Furthermore, the form of the face 34 of the primary optical element 3 allows losses due to reflection off this face 34 as the laser or light beam 1 is exiting to be greatly minimized, the latter striking the face 34 with an incidence that is substantially zero, or very low.

Lastly, the presence of the primary optical element 3 and the convex form of its face 34 allow the light that is diffused in all directions by the converter to be concentrated toward the beam projection objective 5.

According to one variant of the invention, the portion of the primary optical element 3 that receives the incident laser or light beam 1, which portion is denoted by 4, is adapted in that the face 34 is modified in the area receiving the laser or light beam 1: this area, denoted by 41, also bulges but concavely, advantageously substantially taking the form of a spherical cap, preferably centered on the scanning device or mirror 13. In this way, the laser or light beam 1 arrives at the portion 4 of the primary optical element 3 with an incidence that is substantially zero and the parasitic reflections of the light beam 1 off the surface or area 41 are minimized, thus maximizing the luminous flux transmitted.

It is to be noted that the curvatures of the face 34, including that of the area 41, if applicable, must be conventionally taken into account in the optical calculation of the beam projection objective 5.

Furthermore, the portion 4 through which the laser or light beam 1 enters the primary optical element 3 is preferably positioned off-center with respect to the converter element 2, i.e., shifted laterally, so that it does not intercept light emitted by the converter element 2 and liable to enter the beam projection objective 5.

According to another variant of the invention (not shown), the face 34 of the primary optical element 3 is not convex but planar and microstructured in order, in a known manner, to minimize total internal reflection phenomena and facilitate the extraction of light.

By way of example, these microstructures may be microcones, microspheres, random structures, or even diffraction gratings tuned to the wavelength of the laser or light beam 1 in order to substantially cancel out any partial reflection at a given incidence.

An optical device has thus been described that allows parasitic reflections and total internal reflections at the interfaces of its various constituent elements to be minimized, and optical losses to be minimized, thus optimizing the flux exiting the device toward the beam projection objective 5, and this to be achieved in a simple manner, involving the addition of a single optical part—the primary optical element 3—that is simple to produce and furthermore carries out the mechanical protection of the wavelength converter element 2.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. An optical device comprising at least one optical converter element for converting wavelength, formed from a first optical medium having a first refractive index, said at least one optical converter element being configured to receive an incident light beam at a first face and to convert said incident light beam into a converted light beam,
    wherein said optical device further comprises:
    a reflective optical element, positioned on a second face of said at least one optical converter element, said second face being generally opposite said first face, said reflective optical element being configured to reflect said converted light beam;
    a primary optical element, formed from a second optical medium having a second refractive index that is substantially identical to said first refractive index, a first face of said primary optical element being joined to said first face of said at least one optical converter element, said primary optical element being configured to receive said incident light beam and to transmit said incident light beam to said at least one optical converter element, a second face of said primary optical element forming a face of said primary optical element for outputting said converted light beam, said second face of said primary optical element being configured to minimize parasitic reflections of said converted light beam off itself, wherein
    said primary optical element comprises an input portion, configured to receive said incident light beam and positioned off-center with respect to said at least one optical element for converting wavelength, and wherein
    the input portion of the primary optical element extends asymmetrically to one side of said at least one optical element for converting wavelength,
    wherein said second face of said primary optical element concavely bulges at a portion of said input portion,
    wherein said second face of said primary optical element takes the form of a spherical cap at the remaining portion.

2. The optical device according to claim 1, wherein said second face of said primary optical element is convex.

3. The optical device according to claim 2, wherein said second face of said primary optical element substantially takes the form of a spherical cap.

4. The optical device according to claim 2, wherein said primary optical element is bonded to said at least one optical converter element.

5. The optical device according to claim 2, wherein said primary optical element is molded onto said at least one optical converter element, in one and the same material as said at least one optical converter element.

6. The optical device according to claim 2, wherein said incident light beam is monochromatic.

7. The optical device according to claim 1, wherein said second face of said primary optical element substantially takes the form of a spherical cap.

8. The optical device according to claim 7, wherein said spherical cap is substantially centered on said first face of said primary optical element.

9. The optical device according to claim 1, wherein said primary optical element is bonded to said at least one optical converter element.

10. The optical device according to claim 1, wherein said primary optical element is molded onto said at least one optical converter element, in one and the same material as said at least one optical converter element.

11. The optical device according to claim 1, wherein said incident light beam is monochromatic.

12. The optical device according to claim 1, wherein said incident light beam is provided by a laser source.

13. The optical device according to claim 1, wherein said second face of said primary optical element is planar and microstructured so as to minimize total internal reflections off said second face.

14. A light module comprising an optical device according to claim 1, wherein
    said light module additionally comprises a light source providing said incident light beam, a scanner for scanning said incident light beam that is positioned upstream of said primary optical element, and a beam projection objective that receives said incident light beam emerging from said second face of said primary optical element.

15. The light module according to claim 14, wherein said second face of said primary optical element takes the form of a spherical cap at an input portion and wherein said spherical cap is centered on said scanner.

16. A lighting and/or signaling device, in particular for an automotive vehicle, wherein said lighting and/or signaling device comprises an optical device according to claim 1.

* * * * *